April 14, 1970 R. L. KOEPP 3,506,481
CLOSELY MATCHED SINUSOIDAL SHAPED RESISTOR
ELEMENTS AND METHOD OF MAKING
Filed Oct. 13, 1965

INVENTOR
RONALD L. KOEPP

BY Sughrue, Rothwell, Mion, Zinn & Macpeak
ATTORNEYS

United States Patent Office 3,506,481
Patented Apr. 14, 1970

3,506,481
CLOSELY MATCHED SINUSOIDAL SHAPED RESISTOR ELEMENTS AND METHOD OF MAKING

Ronald L. Koepp, Creve Coeur, Mo., assignor to Monsanto Company, St. Louis, Mo., a corporation of Delaware Filed Oct. 13, 1965, Ser. No. 495,520
Int. Cl. B44d *1/18, 1/52;* H01h *37/36*
U.S. Cl. 117—212 2 Claims

ABSTRACT OF THE DISCLOSURE

A pair of closely matched thin film resistors are produced by vapor disposition through a mask defining two interfitting complementary sine wave shaped spaces. By being so interdigitally positioned, the two resistors are equally affected by variations in the deposition process and are equally affected by the same ambient conditions during operation.

This invention relates to thin film electrical resistors of closely matched ohmic values and methods of making same.

The film resistors according to the present invention are constituted by conductor deposits obtained by evaporation of suitable resistance material such as "Nichrome" or the like, in a vacuum, or by coating, decomposition, sputtering (both reactive and physical), and diffusion.

Electronic circuitry such as operational and differential integrated circuit amplifiers require precision matching of certain critical resistors. For example, the load resistors in the first stage of a differential amplifier require accurate matching of values to within 0.1%. This accurate matching of values is needed to eliminate input errors to the differential amplifier which would occur if large variation in the two input resistors was present.

Using conventional techniques, close matching is difficult to obtain because of manufacturing variations which occur during the processing and formation of integrated circuit resistors. In the standard method of making thin film resistors, depositing a conducting layer on a substrate is accomplished in a container, such as a vacuum bell jar, provided with a heated source of conductive material. When heated, the evaporated conductive material is dispersed in a cardiodal pattern presenting a nonuniform surface to the substrate upon which condensation is to take place. Because of this nonuniformity of surface, a variation in the magnitude of the evaporation deposits of the conductive material onto the substrate results. The variation in deposit produces a nonuniform resistance value across the substrate which may approach 20% between the center portion of the bell jar and the end of the substrate holder. The present invention eliminates the variation by condensing the evaporated material through a mask configured such that interdigital patterns form on the substrate. The use of the interdigital patterned mask results in the elimination of the manufacturing error due to the nonuniform dispersal pattern of the evaporated resistance material by subjecting substantially equal area parts of both resistors to the same nonuniformity of evaporated material. Thus, nonuniformities are applied in substantially equal amounts to both resistors resulting in two resistors whose ohmic values are closely matched.

It is important to note that, while the two resistors formed by the process are electrically separate, they are in very close physical proximity to one another. This very close proximity results in advantages in use since both resistors will be subject to the same environmental conditions such as temperature and humidity. Therefore any change in resistance caused by these environmental conditions would occur in both resistors in equal magnitudes thereby preserving the close match in ohmic value between the two.

Prior art methods, while producing resistors by evaporation and condensation onto a substrate, require further testing of the resulting product to determine which ones of the resulting resistors are of equal value; then, those of equal value were selected for use. This required testing involves the consumption of time, and increases the cost of production. Also, the danger of damage to the thin film resistors was present during the testing process. Thus, a further advantage of the present method resides in the fact that no further testing of the two resistors is necessary since the required degree of match between the two resistors is an inherent result of the interdigital shape.

A primary object of this invention is to provide a simple method of manufacturing closely matched thin film resistors.

A further object is the provision of a method of manufacturing resistors whereby further testing to determine the necessary degree of match is unnecessary.

A further object is to provide novel resistor structures whereby a plurality of interdigital resistors are formed having complementary shape, resulting in ease of handling in use, and effecting elimination of a serious manufacturing error in their formation.

The foregoing and other objects, features and advantages of the invention will be apparent from the following more particular description of preferred embodiments of the invention, as illustrated in the accompanying drawings.

Figure 1:
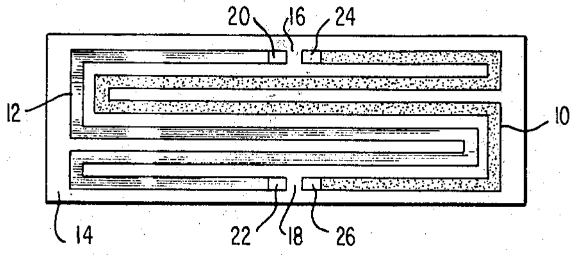
FIGURE 1 shows the novel interdigital resistor structure produced by the present method.

The novel resistor structure produced by the present method is shown in FIGURE 1 where a first resistor, 10, of substantially sinusoidal shape, and a second resistor 12 of a complementary sinusoidal shape, are both mounted on base member 14. Both resistors 10 and 12 are composed of suitable resistance material such as, for example, Nichrome. Base 14, the substrate upon which the resistance material is evaporated, may advantageously be composed of silicon. Spaces 16 and 18 are provided between the ends of the two resistors to effect a complete electrical separation between them. Suitable connection members at the end of each resistor, 20, 22, and 24, 26, are provided to enable connection between the resistors and other circuit elements.

Figure 2:
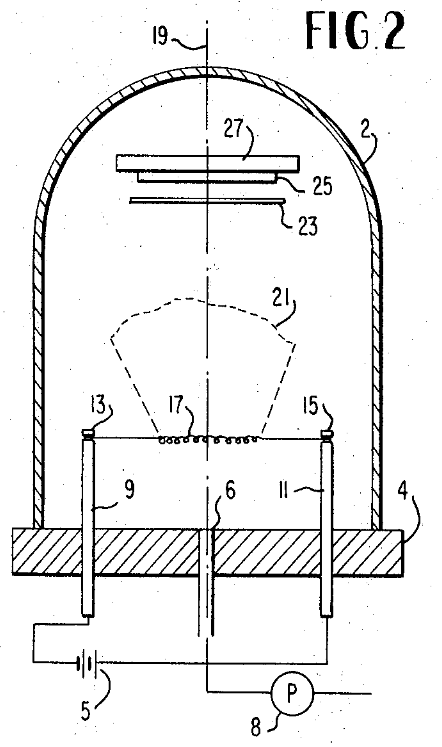
FIGURE 2 is a plan view showing suitable apparatus for carrying out the improved method of the invention.

FIGURE 2 shows the preferred apparatus suitable for performing the method of making closely matched electrical resistors. A bell jar 2 is mounted on a suitable base 4. An aperture 6, through base 4, is connected to a suitable vacuum pump 8 to evacuate the bell jar. A power source 5 is coupled in a series circuit to conductive posts 9 and 11 extending through the base into the evacuated bell jar. An evaporation filament 17 is connected between the end portions 13 and 15 of the two conductive posts in the bell jar. Thus, when the power source 5 is activated, current will flow through the evaporation filament 17 thereby heating the evaporation filament causing particles of Nichrome to be given off in a nonuniform pattern outlined at 21. A mask 23, silicon substrate 25, and a substrate holder 27 are located near the top of the evacuated bell jar. Each of these three elements are centered with respect to center line 19 of the bell jar thus providing equal linear distances on opposite sides of the center line. The silicon substrate 25 is heated through a suitable heat source, not shown.

Figure 6:
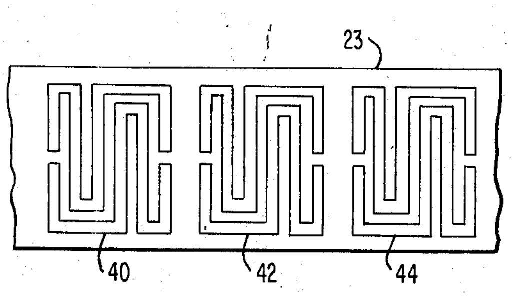
FIGURE 6 shows the mask used to produce the interdigital configuration.

A typical mask 23 for forming the interdigitated matched resistors is shown in FIGURE 6. The mask is formed of any suitable material which is impervious to the evaporated ohmic material and has stencil sections 40, 42, and 44 each formed in the pattern of a desired resistor pair. While only three pairs of interdigitated resistors could be formed by the mask shown in FIGURE 6, it should be understood that in actual practice the mask contains many more stencil sections, each contributing to the formation of a separate pair of resistors during a single evaporation process.

Figure 3:
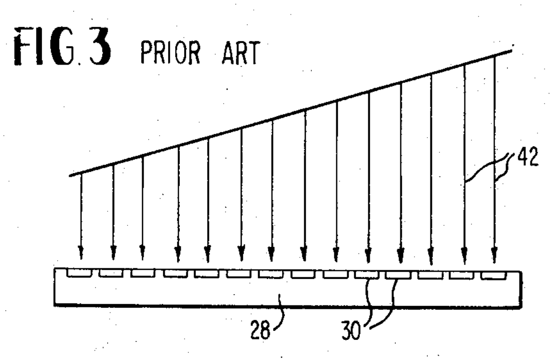
FIGURE 3 shows the variation in ohmic resistance values, across the substrate produced by the prior art method.

Referring back to FIGURE 2, in operation, the bell jar 2 is first evacuated through the use of aperture 6 and vacuum pump 8. Power source 5 is then activated causing Nichrome particles to be given off from evaporation filament 17. These evaporation particles strike the mask 23 allowing only portions of the evaporated particles to pass through to heated substrate 25 where the particles condense in a configuration similar to that of the apertures of mask 23. Thus, a plurality of interdigital resistors of the same configuration as the apertures of mask 23 are formed on silicon substrate 25. By inspection, it is seen that, by the substantially complementary sinusoidal design of the apertures on mask 23, approximately equal area portions of the silicon substrates are subjected to the same volume of Nichrome particles. This results in two resistors of very closely matched ohmic values. FIGURE 3 shows a section of a silicon slice with integrated resistive circuits thereon formed by the prior art method. The nonuniform evaporation caused by the cardiodal shape of the diffusion pattern is represented by the changing size of the arrows 42 wherein the right-hand side of the slice represents the center of the substrate during resistor formation. As can be seen by the inspection of this figure, a one-inch silicon base 28 has a plurality of Nichrome resistive elements 30 thereon. This silicon slice is the result of the prior art method of manufacturing resistors without the interdigital feature of the present invention. The individual silicon resistive circuits 30 must now be separated into individual resistive elements and tested to determine which of these resistors are of approximately equal value, or have values within an allowable tolerance.

Figure 4:
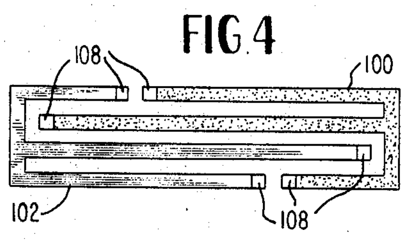
FIGURES 4 and 5 show alternative interdigital configurations.
Figure 5:
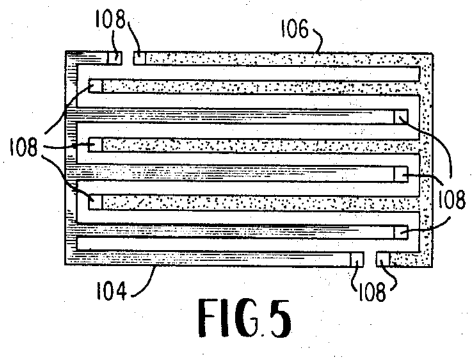

In FIGURES 4 and 5, alternative interdigital configurations are shown. The critical factor of the invention is that all interdigital configurations be designed so that substantially equal area portions of both resistors are interfit with each other to minimize variation in the volume of material deposited on the substrate. Resistors 100 and 102 in FIGURE 4, and 104 and 106 in FIGURE 5 have multiple terminals 108 allowing selection of several matched resistor values for connection to additional circuitry.

Figure 7:
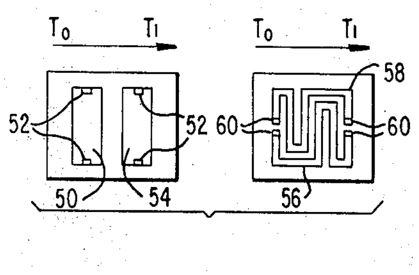
FIGURE 7 shows prior art resistors and the interdigital resistors of the invention subjected to a temperature gradient.

FIGURE 7 shows a comparison between the characteristics of the prior art resistors when subjected to a temperature gradient and the characteristics of the interdigital resistors of the invention subject of the same temperature gradient. As can be seen, the prior art resistors, 50 and 54 having metallic contacts 52, are subject to greater differences in environmental conditions because of the spacing between them. However, the interdigital resistors 56 and 58, having metallic contacts 60, have substantially equal areas which are subjected to equal environmental conditions such as temperature.

Other methods, known in the art, may also be utilized to produce the interdigital resistors of the invention. In the familiar sputtering method, a metal in the finely-divided state is produced by passing a high potential discharge between two electrodes of the metal in a dielectric liquid or gaseous medium. Thus, by utilizing the interdigital configured mask disclosed above, in the path of the finely-divided metal, interdigital resistors are produced by very closely matched ohmic values by again subjecting parts of both resistors to the same errors in metal density on both sides of the center line of the two resistors. Both reactive or physical sputtering may be utilized to produce the resistors of the invention. In the reactive sputtering method, suitable reactive gas at a low partial pressure is introduced into the container. Evaporating atoms of the metal react with gas atoms by a collision mechanism while making the transition from the source to the substrate and by reaction with the absorbed gas atoms on the film surface itself to make metal-gas compound films. In the physical sputtering method, a physical deposition process is used. No chemical reaction of any kind takes place in this method.

The resistors of the invention may also be formed by decomposition. In this method, a mixture of several compounds is first obtained. The mixture is heated causing the breaking down of the substance by splitting it into simpler constituents. Thus, by controlling the shape of the initial mixture, control of the shape of the resulting decomposed product is obtained.

In the diffusion system, spontaneous mixing of one substance with another due to the passage of the molecules of each substance to the empty spaces between molecules of the other substance is obtained. The diffusion of the Nichrome into the silicon substrate occurs in the evaporation and condensation method shown and described in FIGURE 2 of the specification.

What is claimed is:

1. An article of manufacturing comprising: a base, a first thin film electrical resistor having a sinusoidal shape affixed to said base, a second thin film electrical resistor having a sinusoidal shape affixed to said base, said resistors being arranged in interdigital fashion with a maxima of said sinusoid of said first resistor in proximity to the maxima of said sinusoid of said second resistor.

2. A method of making a pair of closely matched thin film resistors, said method being of the type wherein a resistive material is heated to evaporation in a substantially evacuated chamber and the evaporated material is deposited on the surface of a substrate positioned in said chamber to receive said evaporated material, the improvement comprising, forming a mask defining at least two interfitting complementary sine wave shaped spaces and, positioning said mask between said resistive material and said surface to effect a positive deposition of said evaporated material on said surface in the configuration of said spaces.

References Cited

UNITED STATES PATENTS

| | | | |
|---|---|---|---|
| 3,228,794 | 1/1966 | Ames | 117—212 |
| 3,205,855 | 9/1965 | Ault | 117—212 |
| 2,994,848 | 8/1961 | Rayburn | 338—325 X |
| 2,993,815 | 7/1961 | Treptow | 117—212 |
| 2,849,583 | 8/1958 | Pritikin | 117—217 |
| 1,093,968 | 4/1914 | Bicknell | 338—325 |

ALFRED L. LEAVITT, Primary Examiner

A. M. GRIMALDI, Assistant Examiner

U.S. Cl. X.R.

117—38; 338—308, 320